United States Patent
Lim et al.

(10) Patent No.: US 9,177,971 B2
(45) Date of Patent: Nov. 3, 2015

(54) THIN FILM TRANSISTOR ARRAY PANEL AND METHOD FOR MANUFACTURING THE SAME

(71) Applicant: SAMSUNG DISPLAY CO., LTD., Yongin, Gyeonggi-Do (KR)

(72) Inventors: Sang-Uk Lim, Yongin-si (KR); Se-Hyoung Cho, Hwaseong-si (KR); Mee-Hye Jung, Suwon-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/322,062

(22) Filed: Jul. 2, 2014

(65) Prior Publication Data
US 2015/0123114 A1    May 7, 2015

(30) Foreign Application Priority Data
Nov. 5, 2013   (KR) .................. 10-2013-0133403

(51) Int. Cl.
*H01L 29/43*    (2006.01)
*H01L 51/10*    (2006.01)
*H01L 51/48*    (2006.01)
*H01L 27/12*    (2006.01)

(52) U.S. Cl.
CPC .......... *H01L 27/124* (2013.01); *H01L 27/1225* (2013.01); *H01L 27/1259* (2013.01)

(58) Field of Classification Search
CPC .............. H01L 27/124; H01L 27/1259; H01L 27/1225
USPC ................... 257/40, 43, 59, 72, 258, E27.103, 257/E27.104, E21.414, E29.139, E33.053, 257/E51.005, E51.006; 438/22, 30, 34, 48, 438/149; 349/43, 41; 365/145
See application file for complete search history.

(56) References Cited

U.S. PATENT DOCUMENTS

| | | | |
|---|---|---|---|
| 2005/0142679 A1* | 6/2005 | Ahn et al. | 438/30 |
| 2007/0002195 A1 | 1/2007 | Cho | |
| 2007/0002202 A1 | 1/2007 | Song | |
| 2007/0152218 A1 | 7/2007 | Hung | |
| 2007/0159569 A1* | 7/2007 | Sohn et al. | 349/43 |

(Continued)

FOREIGN PATENT DOCUMENTS

| | | |
|---|---|---|
| KR | 10-2005-0005714 A | 1/2005 |
| KR | 10-2009-0016340 A | 2/2009 |

(Continued)

OTHER PUBLICATIONS

Zhang et al.; Numerical Calculation of Gate-Line Delay in Very Large Active Matrix Liquid Crystal Display with Via Holes; IEEE Transactions on Circuits and Systems-1; Fundamental Theory and Applications; vol. 46; No. 4; Apr. 1999; pp. 435-441

*Primary Examiner* — Dao H Nguyen
(74) *Attorney, Agent, or Firm* — Lee & Morse, P.C.

(57) ABSTRACT

A thin film transistor array panel includes a substrate, a gate line extending in a first direction on the substrate, a data line extending in a second direction on the substrate and intersecting the gate line, a thin film transistor connected to the gate line and the data line, an insulating layer on the gate line, the data line, and the thin film transistor, a first auxiliary line on the insulating layer and connected to the gate line, a second auxiliary line on the insulating layer and connected to the data line, and a pixel electrode connected to the thin film transistor.

15 Claims, 7 Drawing Sheets

(56) References Cited

U.S. PATENT DOCUMENTS

2008/0035919 A1* 2/2008 Shin et al. .................. 257/40
2008/0068364 A1* 3/2008 Park et al. .................. 345/206
2010/0117088 A1* 5/2010 Yoon ............................ 257/59
2013/0119390 A1* 5/2013 Kim et al. ................... 257/59

FOREIGN PATENT DOCUMENTS

| KR | 10-2011-0066337 A | 6/2011 |
| KR | 10-2012-0042330 A | 5/2012 |
| KR | 10-2012-0056469 A | 6/2012 |
| KR | 10-2013-0022539 A | 3/2013 |

* cited by examiner

THIN FILM TRANSISTOR ARRAY PANEL AND METHOD FOR MANUFACTURING THE SAME

CROSS-REFERENCE TO RELATED APPLICATION

Korean Patent Application No. 10-2013-0133403, filed on Nov. 5, 2013, in the Korean Intellectual Property Office, and entitled: "THIN FILM TRANSISTOR ARRAY PANEL AND METHOD FOR MANUFACTURING THE SAME," is incorporated by reference herein in its entirety.

BACKGROUND

1. Field

Embodiments relate to a thin film transistor array panel capable of increasing aperture ratio and preventing signal delay of a gate line or a data line, and to a manufacturing method thereof.

2. Description of the Related Art

In general, flat panel displays, e.g., liquid crystal displays and organic light emitting diode displays, include a pair of electric field generating electrodes and an electro-optical active layer interposed therebetween. In the case of the liquid crystal display, a liquid crystal layer is included as the electro-optical active layer, and in the case of the organic light emitting diode display, an organic emission layer is included as the electro-optical active layer.

One of the pair of the electric field generating electrodes is generally connected to a switching element and applied with an electric signal. The electro-optical active layer displays an image by converting the electric signal into an optical signal.

In the flat panel display, a thin film transistor (TFT) that is a three terminal element is used as a switching element. Signal lines, e.g., gate lines that transmit scanning signals to control the thin film transistor and data lines that transmit signals to be applied to a pixel electrode, are provided in the flat panel display.

SUMMARY

According to an embodiment, a thin film transistor array panel includes a substrate, a gate line extending in a first direction on the substrate, a data line extending in a second direction on the substrate and intersecting the gate line, a thin film transistor connected to the gate line and the data line, an insulating layer on the gate line, the data line, and the thin film transistor, a first auxiliary line on the insulating layer and connected to the gate line, a second auxiliary line on the insulating layer and connected to the data line, and a pixel electrode connected to the thin film transistor.

The first auxiliary line and the second auxiliary line may be formed on the same layer.

At least one of the first auxiliary line and the second auxiliary line may be electrically disconnected at a portion where the first auxiliary line and the second auxiliary line intersect each other.

The first auxiliary line may overlap the gate line.

The first auxiliary line may be formed only at a portion corresponding to the gate line.

The second auxiliary line may overlap the data line.

The second auxiliary line may be formed only at a portion corresponding to the data line.

The insulating layer may be provided with a contact hole to expose partially the gate line and the data line.

The first auxiliary line may be connected to the gate line through the contact hole provided in the insulating layer.

The second auxiliary line may be connected to the data line through the contact hole provided in the insulating layer.

The pixel electrode may be formed on the same layer as at least one of the first auxiliary line and the second auxiliary line.

The thin film transistor may be formed on the substrate, and may include a semiconductor including a channel area, a drain area, and a source area; a gate electrode insulated from the channel area and overlapping the same; a source electrode electrically connected to the source area; and a drain electrode electrically connected to the drain area.

According to another embodiment, a method for manufacturing a thin film transistor array panel includes forming a gate line extending in a first direction on a substrate, forming a data line extending in a second direction on the substrate and intersecting the gate line, forming a thin film transistor connected to the gate line and the data line, forming an insulating layer on the gate line, the data line, and the thin film transistor, forming a first auxiliary line on the insulating layer and connected to the gate line, forming a second auxiliary line on the insulating layer and connected to the data line, and foaming a pixel electrode connected to the thin film transistor According to another embodiment, a method for manufacturing a thin film transistor array panel includes forming a gate electrode and a gate line on a substrate, forming an active layer on the gate electrode, forming a source electrode, a data line intersecting the gate line, and a drain electrode on the substrate, forming an insulating layer on the substrate where the gate electrode, the source electrode, the drain electrode, the active layer, the gate line, and the data line are formed, forming a contact hole in the insulating layer to expose the gate line and the data line, forming a first auxiliary line on the insulating layer to be connected to the gate line, and a second auxiliary line on the insulating layer to be connected to the data line, forming a passivation layer on the first auxiliary line, the second auxiliary line, and the insulating layer, and forming a contact hole in the passivation layer to expose the drain electrode, and a pixel electrode to be connected to the drain electrode.

According to yet another embodiment, a method for manufacturing a thin film transistor array panel includes forming a gate electrode and a gate line on a substrate, forming an active layer on the gate electrode, forming a source electrode, a data line intersecting the gate line, and a drain electrode on the substrate, forming an insulating layer on the substrate where the gate electrode, the source electrode, the drain electrode, the active layer, the gate line, and the data line are formed, forming a contact hole in the insulating layer to expose the gate line, the data line, and the drain electrode, and forming a first auxiliary line on the insulating layer to be connected to the gate line, a second auxiliary line on the insulating layer to be connected to the data line, and a pixel electrode on the insulating layer to be connected to the drain electrode.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
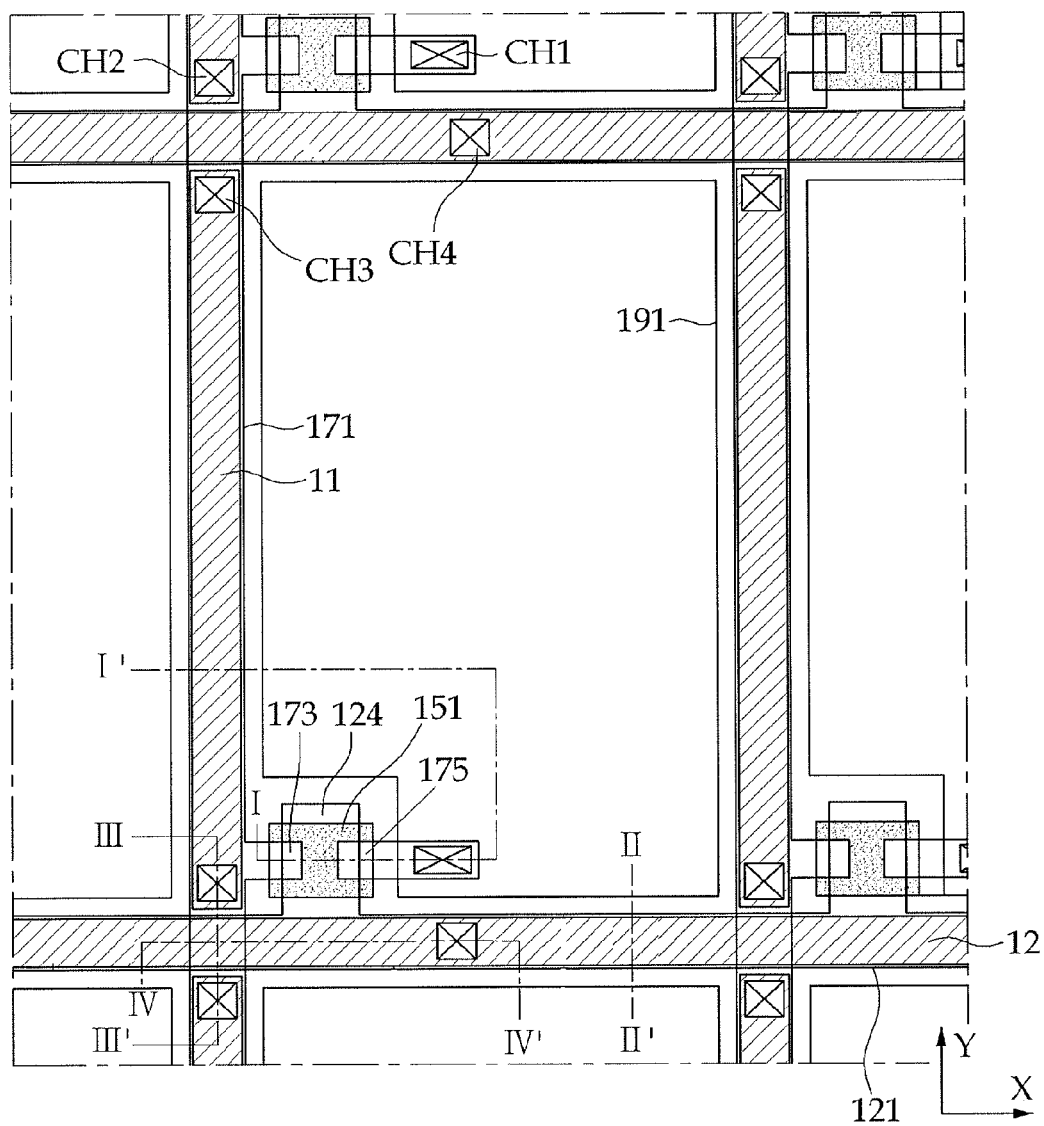
FIG. 1 illustrates a plan view showing a pixel of a thin film transistor array panel according to a first embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

The terminology used herein is for the purpose of describing particular embodiments only and is not construed as limiting. As used herein, the singular forms "a," "an" and "the" are intended to include the plural forms as well, unless the context clearly indicates otherwise. It will be further understood that the terms "comprises" and/or "comprising," when used in this specification, specify the presence of mentioned component, step, operation and/or element, but do not exclude the presence or addition of one or more other components, steps, operations and/or elements.

Unless otherwise defined, all terms used herein (including technical and scientific terms) have the same meaning as commonly understood by those skilled in the art. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, a thin film transistor array panel according to a first embodiment of will be described in detail with reference to FIGS. 1 to 3.

FIG. 1 is a plan view showing a pixel of a thin film transistor array panel according to a first embodiment. FIG. 2 is a cross-sectional view of the thin film transistor array panel taken along lines I-I' and II-II' of FIG. 1. FIG. 3 is a cross-sectional view of the thin film transistor array panel taken along lines III-III' and IV-IV' of FIG. 1.

Figure 3:
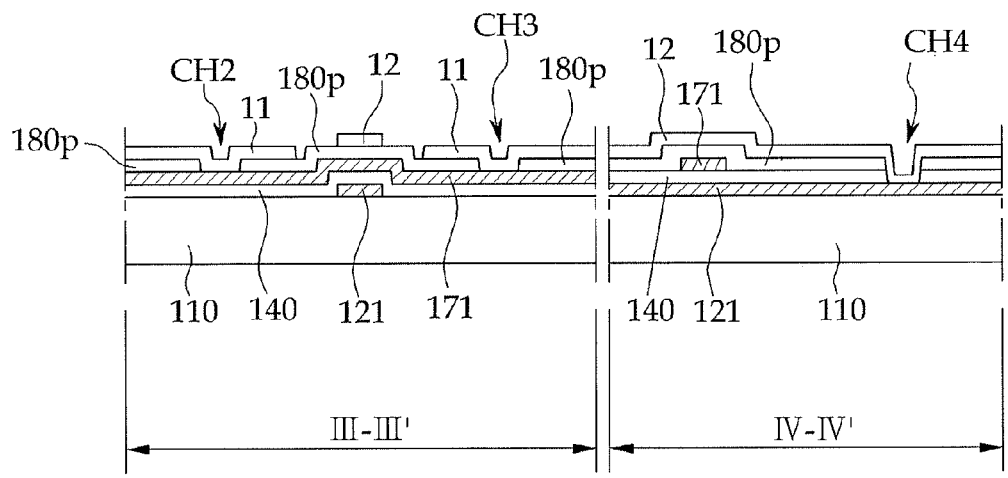
FIG. 3 illustrates a cross-sectional view along lines and IV-IV' of FIG. 1.

Referring to FIGS. 1 and 3, a plurality of gate lines 121 and gate electrodes 124 are disposed on a substrate 110 including glass, plastic, or the like. In detail, the gate line 121 transmits a gate signal and extends in a first direction. Each of the gate lines 121 includes a plurality of gate electrodes 124 protruding from the gate line 121, and an end portion (not shown) having a wide area for connection to a different layer or an external driving circuit. The first direction may be horizontal as illustrated in FIG. 1, but this is not limited to the horizontal direction.

The gate line 121 may be made of an aluminum-based metal, e.g., aluminum or an aluminum alloy, having low specific resistance. However, the gate line 121 may be made of a silver-based metal, e.g., silver or a silver alloy, a copper-based metal, e.g., copper or a copper alloy, a molybdenum-based metal, e.g., molybdenum or a molybdenum alloy, chromium, tantalum, titanium, and the like, and/or may have a multilayer structure that includes two conductive layers (not shown) having different physical properties.

A gate insulating layer 140, e.g., including silicon nitride ($SiN_x$) or silicon oxide ($SiO_x$), may be formed on the gate line 121 and the gate electrode 124. A plurality of semiconductors 151, e.g., including hydrogenated amorphous silicon (a-Si), polysilicon, or the like, may be formed on the gate insulating layer 140. The semiconductor 151 may extend in a vertical direction, and may include a plurality of projections 154 extending toward the gate electrode 124.

Figure 2:
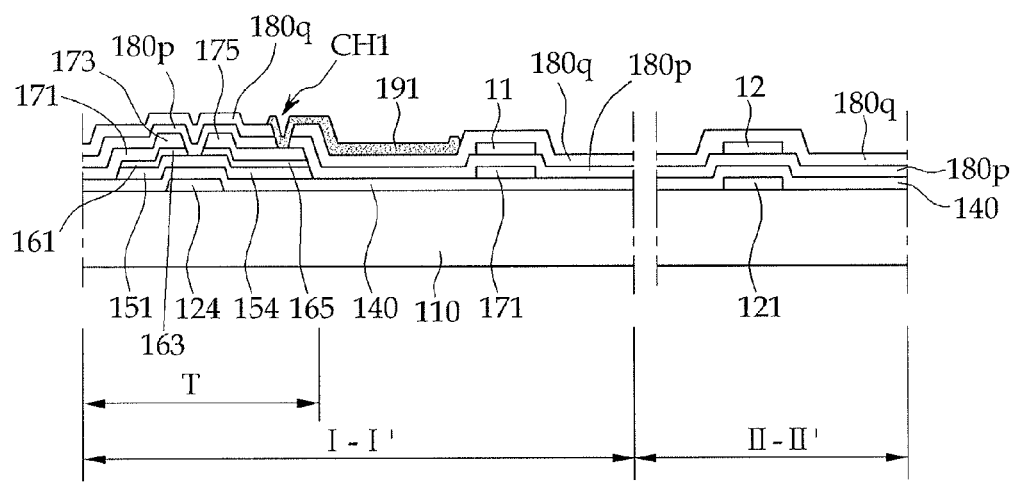
FIG. 2 illustrates a cross-sectional view along lines I-I' and II-II' of FIG. 1.

In the embodiment illustrated in FIGS. 2 and 3, the plurality of semiconductors 151 may include oxide semiconductor. The oxide semiconductor may include, e.g., at least one of zinc (Zn), gallium (Ga), indium (In), and tin (Sn). For example, the oxide semiconductor may be formed by using an oxide based on zinc (Zn), gallium (Ga), tin (Sn), or indium (In), or an oxide semiconductor material, e.g., zinc oxide (ZnO), indium-gallium-zinc oxide ($InGaZnO_4$), Indium-zinc oxide (In—Zn—O), and zinc-tin oxide (Zn—Sn—O), which are complex oxides.

For example, the oxide semiconductor may include an IGZO-based oxide consisting of indium (In), gallium (Ga), zinc (Zn), and oxygen (O). In another example, the oxide semiconductor may include In—Sn—Zn—O-based metal oxide, In—Al—Zn—O-based metal oxide, Sn—Ga—Zn—O-based metal oxide, Al—Ga—Zn—O-based metal oxide, Sn—Al—Zn—O-based metal oxide, In—Zn—O-based metal oxide, Sn—Zn—O-based metal oxide, Al—Zn—O-based metal oxide, In—O-based metal oxide, Sn—O-based metal oxide, and/or Zn—O-based metal oxide.

A plurality of ohmic contact layers 161 and 165 may be formed on the semiconductor 151 to reduce contact resistance. The ohmic contact layers 161 and 165 may be made of a material such as n+ hydrogenated amorphous silicon which is doped with n-type impurities such as phosphorus (P) at a high concentration, or may be made of silicide. The ohmic contact layer 161 may include a plurality of projections 163, and the projections 163 and the ohmic contact layer 165 may be disposed in pairs on the projections 154 of the semiconductor 151.

A plurality of data lines 171 and a plurality of drain electrodes 175 may be formed on the ohmic contact layers 161 and 165, and on the gate insulating layer 140. The data line 171 transmits a data signal, and extends in a second direction so as to intersect the gate line 121. The second direction may be vertical as illustrated in FIG. 1. Each data line 171 includes a plurality of source electrodes 173 extending toward the gate electrodes 124, and an end portion (not shown) having a wide area for connection to a different layer or an external driving circuit. The data line 171 may include, e.g., chromium that has excellent physical, chemical, and electrical contact characteristics with indium tin oxide (ITO) and indium zinc oxide (IZO).

The drain electrode 175 may be separated from the data line 171, and may face a source electrode 173 with respect to the gate electrode 124. In detail, the source electrode 173, the drain electrode 175, and the data line 171 may be made of a refractory metal, e.g., molybdenum, chromium, tantalum and titanium, or their alloys, and may have a multilayer structure that includes the refractory metal layer and low resistance conductive layer. The multilayer structure may include, e.g., a double layer including a chromium or molybdenum (or its alloy) lower layer and an aluminum (or its alloy) upper layer, or a triple layer including a molybdenum (or its alloy) lower layer, an aluminum (or its alloy) intermediate layer, and a molybdenum (or its alloy) upper layer. The source electrode 173, the drain electrode 175, and the data line 171 may include many different conductive materials in addition to the materials described above.

One gate electrode 124, one source electrode 173, and one drain electrode 175 constitute one thin film transistor (TFT) in conjunction with the projection 154 of the semiconductor 151, and a channel of the thin film transistor is formed at the projection 154 between the source electrode 173 and drain electrode 175.

The ohmic contact layers 161 and 165 exist only between the underlying semiconductor 151, and the overlying data line 171 and drain electrode 175, respectively, and reduce contact resistance therebetween. The semiconductor 151 includes a portion between the source electrode 173 and the drain electrode 175, and also a portion that is not covered by the data line 171 and the drain electrode 175.

An insulating layer 180p is formed on the gate line 121, the data line 171, the source electrode 173, the drain electrode 175, and the exposed portion of the semiconductor 151. The insulating layer 180p may be made of an inorganic insulator, e.g., silicon nitride or silicon oxide, an organic insulator, or an insulator having a low dielectric constant. A plurality of contact holes CH2, CH3, CH4, and CH5 are formed in the insulating layer 180p to expose the gate line 121 and the data line 171, respectively.

A first auxiliary line 12 configured to be connected to the gate line 121 and a second auxiliary line 11 configured to be connected to the data line 171 are formed on the insulating layer 180p. The first auxiliary line 12 and the second auxiliary line 11 may be formed on, e.g., directly on, the same layer, e.g., both the first and second auxiliary lines 12 and 11 may be directly on the insulating layer 180p. Therefore, the first auxiliary line 12 and the second auxiliary line 11 may be simultaneously formed by the same mask process.

For example, the first auxiliary line 12 and the second auxiliary line 11 may include an aluminum-based metal, e.g., aluminum (Al) or an aluminum alloy, having a low specific resistance so as to reduce gate signal delay or voltage drop. In another example, the first auxiliary line 12 and the second auxiliary line 11 may include molybdenum (Mo) or a molybdenum alloy, e.g., molybdenum tungsten alloy (MoW), chromium (Cr), tantalum (Ta), and/or titanium (Ti) that have excellent physical, chemical, and electrical contact characteristics with other materials, e.g., indium tin oxide (ITO) and indium zinc oxide (IZO).

The first auxiliary line 12 may overlap the gate line 121. Further, the first auxiliary line 12 may be formed only at a portion corresponding to the gate line 121. Two ends of the first auxiliary line 12, which are disposed in a non-display area, may be connected to two ends of the gate line 121, which are disposed in the non-display area. As illustrated in FIGS. 1 and 3, the first auxiliary line 12 may be connected to the gate line 121 through the contact hole CH4 in a display area provided in the insulating layer 180p. The number of the contact holes CH4 for connecting the first auxiliary line 12 and the gate line 121 per pixel may be determined by considering prevention of signal delay and process efficiency. For example, in the second embodiment, there are two contact holes CH4 for connecting the first auxiliary line 12 and the gate line 121 per pixel, as will be described below in detail with reference to FIGS. 4 and 5.

The second auxiliary line 11 may overlap the data line 171. Further, the second auxiliary line 11 may be formed only at a portion corresponding to the data line 171. Two ends of the second auxiliary line 11, which are disposed in a non-display area, may be connected to two ends of the data line 171, which are disposed in the non-display area. The second auxiliary line 11 may be connected to the data line 171 through the contact holes CH2 and CH3 in a display area provided in the insulating layer 180p. The number of the contact holes CH2 and CH3 for connecting the second auxiliary line 11 and the data line 171 per pixel may be determined by considering prevention of signal delay and process efficiency.

The first auxiliary line 12 and the second auxiliary line 11 are separated from each other at an intersection thereof in order to be formed on the same layer and apply different signals. Consequently, at least one of the first auxiliary line 12 and the second auxiliary line 11 may be electrically disconnected at a portion where the first auxiliary line 12 and the second auxiliary line 11 intersect each other. The disconnection refers to a break in a connection by separating one line from another. As illustrated in FIGS. 1 and 3, the second auxiliary line 11 is configured to be electrically disconnected at the intersection of the first auxiliary line 12 and the second auxiliary line 11 in the first embodiment. In other words, as illustrated in FIGS. 1 and 3, a portion of the second auxiliary line 11 is removed from the intersection of the data and gate lines 171 and 121, so only the first auxiliary line 12 crosses the intersection of the data and gate lines 171 and 121. For example, as illustrated in the left side of FIG. 3, a portion of the second auxiliary line 11 is removed to expose the first auxiliary line 12, e.g., the second auxiliary line 11 is spaced apart from the first auxiliary line 12 along the y-axis at the intersection of the data and gate lines 171 and 121 so the right side of FIG. 3 shows the absence of the second auxiliary line 11 from the intersection of the data and gate lines 171 and 121.

As a result of the first auxiliary line 12 and the second auxiliary line 11 being disposed as described above, the resistance of the gate line 121 and the data line 171 is greatly reduced. The gate line 121 and the data line 171 may be ultimately configured to be a double wiring in example embodiments. Because the resistance of the gate line 121 and the data line 171 is greatly reduced, the delay of a gate signal and a data signal may be reduced. For example, in the case where the first auxiliary line 12 is formed and both ends of the gate line 121 are connected to those of the first auxiliary line 12, signal delay time (RC Delay Time) is decreased by one third, compared with a single gate line. In the case of adding one contact hole for each pixel within a display area, signal delay time (RC Delay Time) is decreased by one fifth, compared with a single gate line. An effect of preventing signal delay may be achieved by forming the first auxiliary line 12 and the second auxiliary line 11 without decreasing aperture ratio in embodiments. In other words, it is not necessary to increase widths of the gate line 121 and the data line 171 for prevention of signal delay, but rather the widths of the gate line 121 and the data line 171 may decrease in consideration of the effect of prevention of signal delay, thereby increasing aperture ratio.

A passivation layer 180$q$ may be disposed on the insulating layer 180$p$, the first auxiliary line 12, and the second auxiliary line 11. The passivation layer 180$q$ may be made of an inorganic insulator, e.g., silicon nitride or silicon oxide, an organic insulator, or an insulator having a low dielectric constant. The passivation layer 180$q$ has a plurality of contact holes CH1 configured to expose the drain electrodes 175, respectively.

A plurality of pixel electrodes 191 may be formed on the passivation layer 180$q$. The pixel electrode 191 may be made of a transparent conductive material, e.g., ITO or IZO, or a reflective metal, e.g., aluminum, silver, or alloys thereof.

The pixel electrode 191 is physically and electrically connected to the drain electrode 175 through the contact hole CH1, and is applied with a data voltage from the drain electrode 175. An electric field is generated by the pixel electrode 191, to which the data voltage is applied, in conjunction with a common electrode (not shown) of a different display panel (not shown) to which a common voltage is applied, thereby determining a direction of liquid crystal molecules (not shown) of a liquid crystal layer (not shown) between the two electrodes. The pixel electrode 191 and the common electrode form a capacitor (hereinafter referred to as a "liquid crystal capacitor") to maintain the applied voltage after a thin film transistor is turned off.

In the case where embodiments relate to a configuration of an organic light emitting diode display, the organic light emitting diode display includes an organic light emitting layer (not shown) on the pixel electrode 191 and an opposite electrode (not shown) on the organic light emitting layer, as will be described below in more detail.

The pixel electrode 191 serving as an anode electrode of the organic light emitting diode display is formed on the passivation layer 180$q$. The pixel electrode 191 is connected to the drain electrode 175 through the contact hole CH1 of the passivation layer 180$q$. A pixel defining layer (not shown) having an opening configured to expose the pixel electrode 191 is formed on the passivation layer 180$q$. The pixel electrode 191 is disposed to correspond to the opening of the pixel defining layer (not shown), but is not necessarily disposed at the opening of the pixel defining layer. The pixel electrode 191 may be disposed under the pixel defining layer so that a portion of the pixel electrode 191 overlaps the pixel defining layer. The pixel defining layer may be made of, e.g., a polyacrylate resin, polyimide resin, silica-based inorganic material, or the like.

The organic light emitting layer (not shown) is formed on the pixel electrode 191, and the opposite electrode (not shown) serving as a cathode electrode is formed on the organic light emitting layer. As described above, an organic light emitting diode display 40 is formed to include the pixel electrode 191, the organic light emitting layer, and the opposite electrode.

The organic light emitting layer (not shown) may include a low molecular weight organic material or a high molecular weight organic material. Further, the organic light emitting layer may be formed to be a multilayer including at least one of an emission layer, hole injection layer (HIL), hole transporting layer (HTL), electron transporting layer (ETL), and electron injection layer (EIL). In the case where the organic light emitting layer includes all of the emission layer, hole injection layer (HIL), hole transporting layer (HTL), electron transporting layer (ETL), and electron injection layer (EIL), the hole injection layer (HIL) is disposed on the pixel electrode 191 serving as an anode, and the hole transporting layer (HTL), emission layer, electron transporting layer (ETL), and electron injection layer (EIL) are sequentially laminated on the hole injection layer (HIL). The organic light emitting layer may be disposed on the pixel electrode 191 within the opening of the pixel defining layer (not shown) and may also be disposed between the pixel defining layer and the opposite electrode.

The pixel electrode 191 and the opposite electrode (not shown) may be made of a transparent conductive material, and a transflective or reflective conductive material, respectively. The organic light emitting diode display may be classified into a top-emission type, a bottom-emission type, and a dual-emission type according to kinds of materials included in the pixel electrode 191 and the opposite electrode.

The transparent conductive material may include, e.g., indium tin oxide (ITO), indium zinc oxide (IZO), zinc oxide (ZnO), indium oxide ($In_2O_3$), or the like. The reflective material and transflective material may include lithium (Li), calcium (Ca), lithium fluoride/calcium (LiF/Ca), lithium fluoride/aluminum (LiF/Al), aluminum (Al), silver (Ag), magnesium (Mg), gold (Au), or the like.

A sealing member (not shown) may be disposed to face the substrate 110 on the opposite electrode (not shown). The sealing member may include a transparent material, e.g., glass and/or plastic. The sealing member is coupled to the substrate 110 and sealed with a sealant formed along an edge of the substrate 110.

Next, a thin film transistor array panel according to a second embodiment will be described below with reference to FIGS. 4 and 5. The thin film transistor array panel according to the second embodiment is similar to the thin film transistor array panel according to the first embodiment, and thus a description of same elements will be omitted. The second embodiment is different from the first embodiment in having two contact holes configured to connect the gate line 121 to the first auxiliary line 12 per pixel, and it will be described below in more detail.

Figure 4:
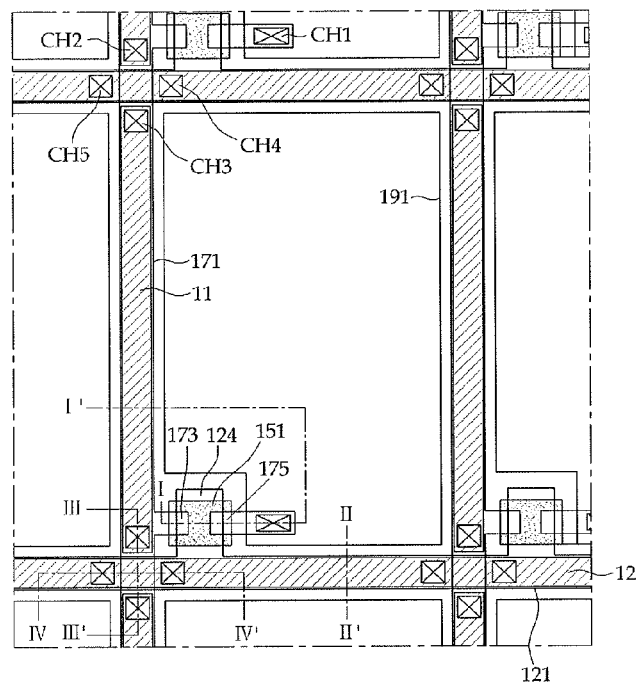
FIG. 4 illustrates a plan view showing a pixel of a thin film transistor array panel according to a second embodiment.

FIG. 4 is a plan view showing a pixel of the thin film transistor array panel according to the second embodiment. FIG. 5 is a cross-sectional view of the thin film transistor array panel taken along lines III-III' and IV-IV' of FIG. 4.

In the case of the thin film transistor array panel according to the second embodiment, the gate line 121, the gate insulating layer 140, the data line 171, the thin film transistor, and the insulating layer 180$p$ are laminated on the substrate 110 as in the first embodiment.

The first auxiliary line 12 may be connected to the gate line 121 through the contact holes CH4 and CH5 within the display area provided in the insulating layer 180$p$. As illustrated in FIG. 4, the contact holes CH4 and CH5 may be disposed at an intersection of the first auxiliary line 12 and the second auxiliary line 11. As illustrated in FIG. 5, the first auxiliary line 12 may be connected to the gate line 121 through the two contact holes CH4 and CH5. In this case, the signal delay time may be further reduced as described above. The number of the contact holes CH4 and CH5 per pixel and the position thereof may be determined by considering prevention of signal delay and process efficiency.

Next, a thin film transistor array panel according to a third embodiment will be described below with reference to FIGS. 6 and 7. The thin film transistor array panel according to the third embodiment is similar to the thin film transistor array panel according to the first and second embodiments, so a description of same elements will be omitted. The third embodiment is different from the first and second embodiments in separating the second auxiliary line 11 at the intersection of the first auxiliary line 12 and the second auxiliary line 11, and it will be described below in more detail.

Figure 6:
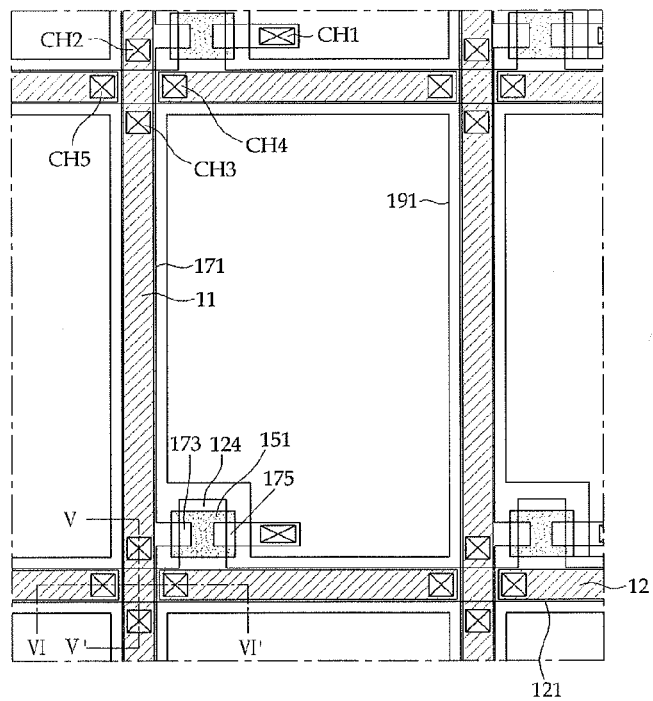
FIG. 6 illustrates a plan view showing a pixel of a thin film transistor array panel according to a third embodiment.
Figure 7:
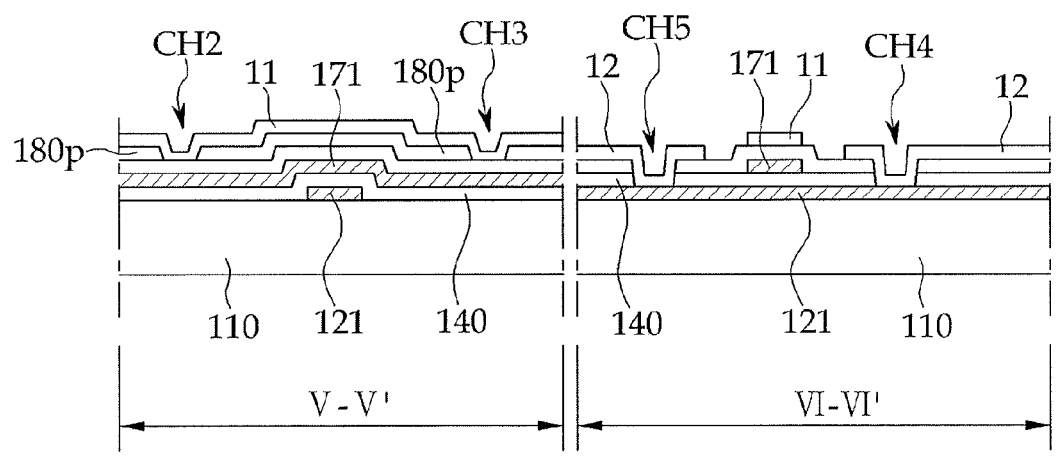
FIG. 7 illustrates a cross-sectional view along lines V-V' and VI-VI' of FIG. 6.

FIG. 6 is a plan view showing a pixel of the thin film transistor array panel according to the third embodiment. FIG. 7 is a cross-sectional view of the thin film transistor array panel taken along lines V-V' and VI-VI' of FIG. 6.

In the case of the thin film transistor array panel according to the third embodiment, the gate line 121, the gate insulating layer 140, the data line 171, the thin film transistor, and the insulating layer 180p are laminated on the substrate 110 as in the first embodiment. Further, the first auxiliary line 12 is connected to the gate line 121 through the two contact holes CH4 and CH5 per pixel as in the second embodiment.

As described above, the first auxiliary line 12 and the second auxiliary line 11 are separated from each other at the intersection thereof in order to be formed on the same layer and apply different signals. Consequently, at least one of the first auxiliary line 12 and the second auxiliary line 11 may be electrically disconnected at a portion where the first auxiliary line 12 and the second auxiliary line 11 intersect each other. The disconnection refers to a break in a connection by separating one line from another. As illustrated in FIGS. 6 and 7, the first auxiliary line 12, rather than the second auxiliary line 11, is configured to be electrically disconnected at an intersection of the first auxiliary line 12 and the second auxiliary line 11 in the third embodiment.

The pixel electrode 191 is formed on the same layer as at least one of the first auxiliary line 12 and the second auxiliary line 11 in a thin film transistor array panel according to a fourth embodiment. In detail, an organic light emitting diode display according to the fourth embodiment may be formed to be a top-emission type. In other words, an image is displayed by emitting light from the organic light emitting layer (not shown) toward the opposite electrode (not shown). In such a case, the pixel electrode 191 may include a reflective material and a transflective material. The reflective material and the transflective (semi-transmissive) material may include, e.g., lithium (Li), calcium (Ca), lithium fluoride/calcium (LiF/Ca), lithium fluoride/aluminum (LiF/Al), aluminum (Al), silver (Ag), magnesium (Mg), gold (Au), or the like.

In the case where the pixel electrode 191 includes the reflective material and the transflective material as described above, the pixel electrode 191 may be made of the same material as at least one of the first auxiliary line 12 and the second auxiliary line 11. For example, the pixel electrode 191, the first auxiliary line 12, and the second auxiliary line 11 may be simultaneously formed by one mask.

The first to fourth embodiments describe configurations varying depending on the number of the contact holes configured to connect the gate line 121 and the data line 171 to the auxiliary lines 11 and 12, the position of the contact holes, and the separation structure of the auxiliary lines 11 and 12. Therefore, the first auxiliary line 12, the second auxiliary line 11, and the contact holes CH2, CH3, CH4, and CH5 may be variously configured in consideration of increase of aperture ratio, signal delay reduction of the gate line 121 and the data line 171, and process efficiency in embodiments.

Figure 5:
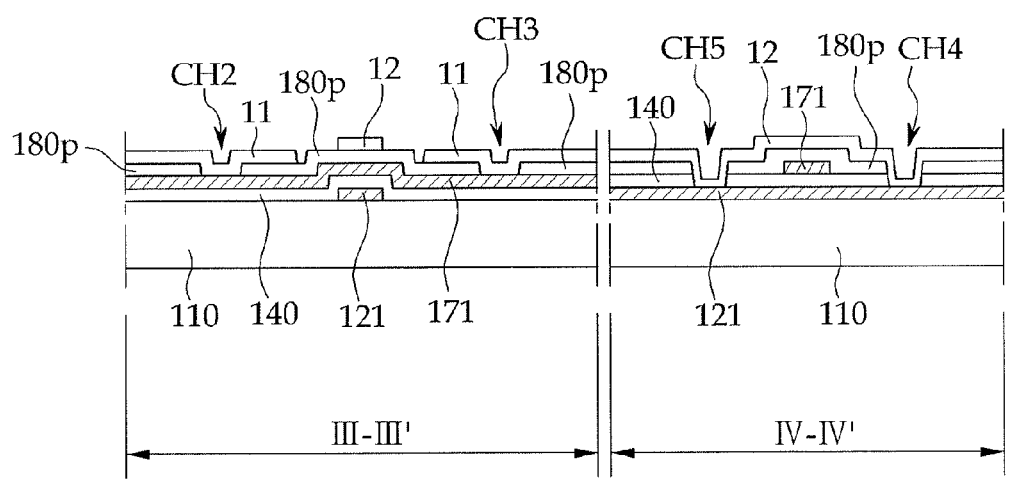
FIG. 5 illustrates a cross-sectional view along lines III-III' and IV-IV' of FIG. 4.

Next, a method for manufacturing the thin film transistor array panel according to the second embodiment, which is illustrated in FIGS. 4 and 5, will be described below in detail with reference to FIGS. 8A to 8G. FIGS. 8A to 8G are cross-sectional views taken along lines III-III' and IV-IV' of FIG. 4 to illustrate stages in a manufacturing method of a thin film transistor array panel according to embodiments.

Figure 8A:
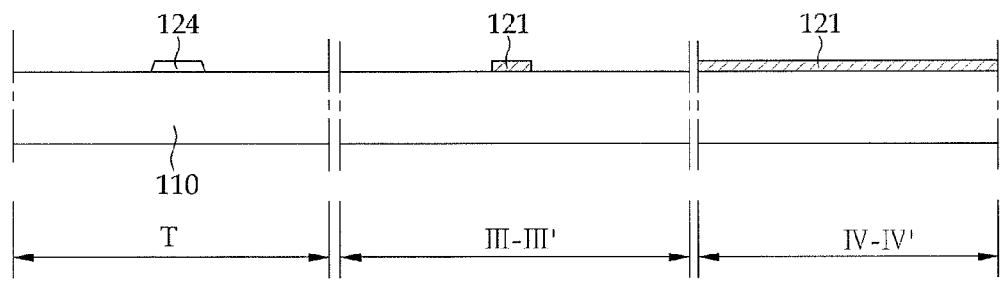
FIGS. 8A to 8G are cross-sectional views along lines and IV-IV' of FIG. 4 that illustrate stages in a method of manufacturing the thin film transistor array panel according to the second embodiment.

As illustrated in FIG. 8A, a metal layer is formed on the substrate 110, which is made of transparent glass or plastic. The metal layer is patterned to form the gate line 121 including the gate electrode 124.

Figure 8B:
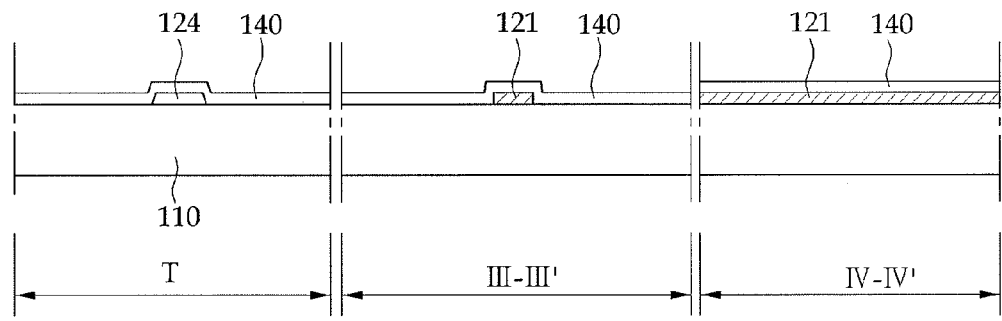

As shown in FIG. 8B, the gate insulating layer 140 and a semiconductor layer (not shown) are sequentially laminated on the gate electrode 124 and the gate line 121 by chemical vapor deposition (CVD). Next, a data metal layer (not shown) is deposited by sputtering.

Figure 8C:
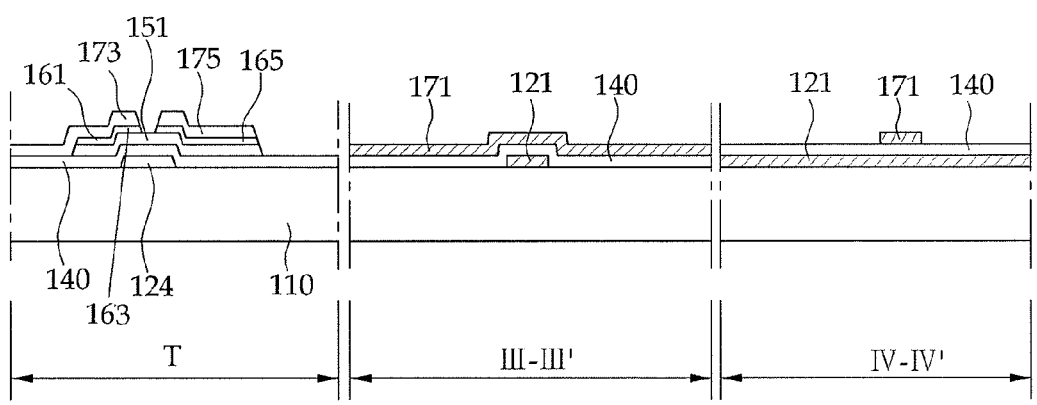

As shown in FIG. 8C, the semiconductor layer (not shown) and the data metal layer (not shown) are all etched by using an etching mask (not shown) to form a data metal pattern, an ohmic contact layer pattern, and a semiconductor 151. The exposed data metal pattern and ohmic contact layer pattern are removed to form the data line 171 including the source electrode 173, the drain electrode 175, and the ohmic contact layers 161 and 165. The data line 171 and the drain electrode 175 have the same shape in a plan view as the ohmic contact layers 161 and 165 and the semiconductors 151 and 154, except for the exposed portion between the drain electrode 175 and the source electrode 173.

Figure 8D:
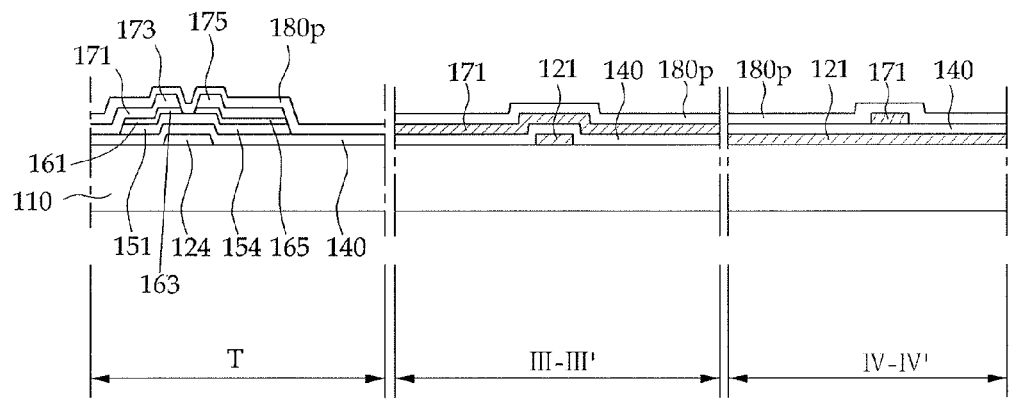

As shown in FIG. 8D, the insulating layer 180p is formed on the gate line 121, the data line 171, the source electrode 173, the drain electrode 175, and the exposed portion of the semiconductor 151.

Figure 8E:
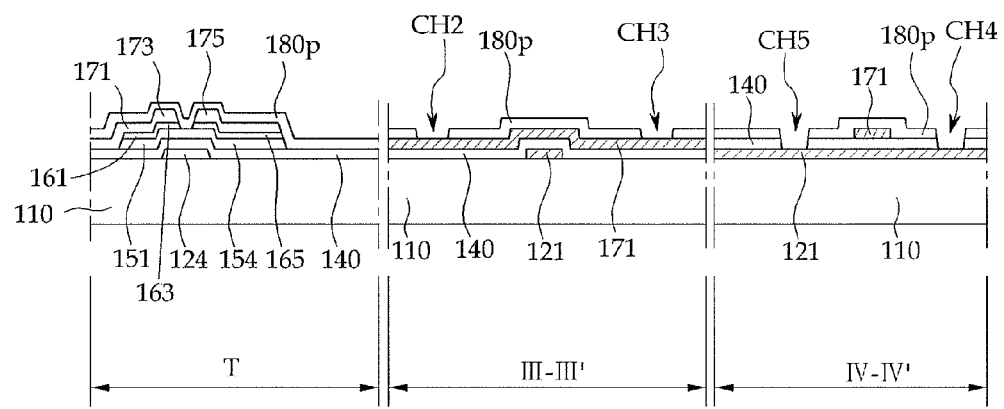

As shown in FIG. 8E, the plurality of contact holes CH2, CH3, CH4, and CH5 are disposed on the insulating layer 180p to expose the gate line 121 and the data line 171, respectively.

Figure 8F:
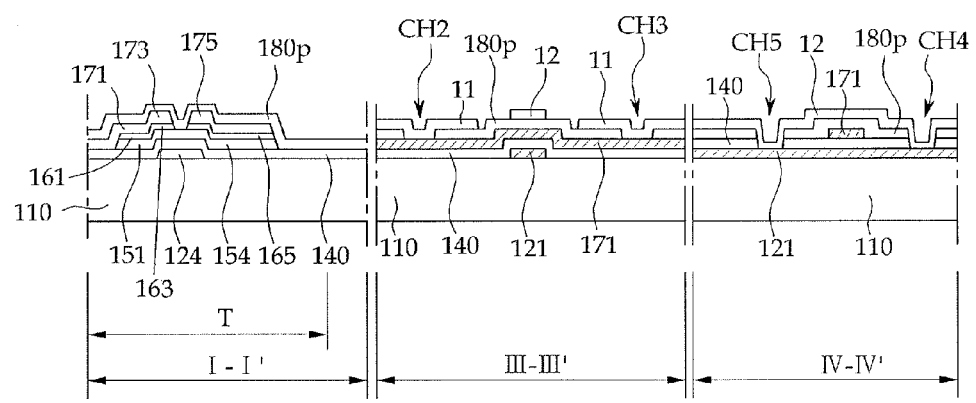

As shown in FIG. 8F, the first auxiliary line 12 is formed on the insulating layer 180p and is connected to the gate line 121 through the contact holes CH4 and CH5, and the second auxiliary line 11 is formed on the insulating layer 180p and is connected to the data line 171 through the contact holes CH2 and CH3. The first auxiliary line 12 and the second auxiliary line 11 may be formed on the same layer. Therefore, the first auxiliary line 12 and the second auxiliary line 11 may be simultaneously formed by the same mask process. The second auxiliary line 11 may be formed by using a patterned mask so as to be separated, e.g., discontinuous, at an intersection of the first auxiliary line 12 and the second auxiliary line 11.

Figure 8G:
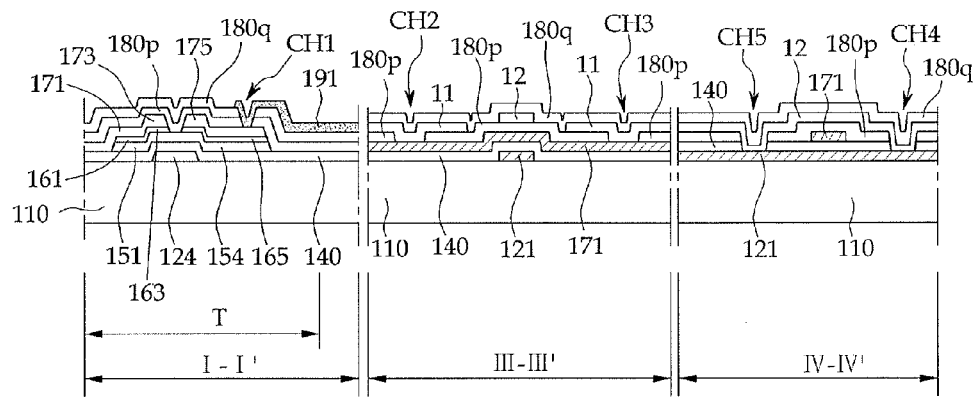

As shown in FIG. 8G, the passivation layer 180q is formed on the insulating layer 180p, the first auxiliary line 12, and the second auxiliary line 11. The passivation layer 180q includes the plurality of contact holes CH1 configured to expose the drain electrode 175. The plurality of pixel electrodes 191 is formed on the passivation layer 180q.

Meanwhile, an organic light emitting diode display according to an embodiment may further include a pixel defining layer (not shown), an organic light emitting layer (not shown), and an opposite electrode (not shown). In the case of an organic light emitting diode display according to the fourth embodiment, the pixel electrode 191 may be formed on the same layer as at least one of the first auxiliary line 12 and the second auxiliary line 11. For example, the pixel electrode 191, the first auxiliary line 12, and the second auxiliary line 11 may be simultaneously formed on the passivation layer 180q by a single mask. In the case of forming the pixel electrode 191 as above, the pixel electrode 191 may include the reflective material and the transflective (semi-transmissive) material as previously described.

The thin film transistor array panel manufactured by the above method may increase aperture ratio, reduce resistance of the gate line 121 and the data line 171, and also reduce signal delay of the gate line 121 and the data line 171.

By way of summary and review, a conventional thin film transistor array panel with a large area and a high integration includes a signal delay. The signal delay weakens a fast response characteristic, thereby deteriorating image quality. In order to reduce the signal delay, attempts may be potentially made to increase cross-sectional areas of the gate and data lines to decrease resistance. However, such cross-sectional increase of the gate and data lines may be physically limited in terms of the manufacturing process.

In contrast, according to embodiments, a thin film transistor array panel may be configured to include a first auxiliary line and a second auxiliary line connected to the gate and data lines, respectively, thereby preventing signal delay of the gate line and the data line. Therefore, according to embodiments, the thin film transistor array panel may increase aperture ratio and improve signal delay by arranging the first auxiliary line and the second auxiliary line.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thin film transistor array panel, comprising:
    a substrate;
    a gate line extending in a first direction on the substrate;
    a data line extending in a second direction on the substrate and intersecting the gate line;
    a thin film transistor connected to the gate line and the data line;
    an insulating layer on the gate line, the data line, and the thin film transistor;
    a first auxiliary line on the insulating layer and connected to the gate line;
    a second auxiliary line on the insulating layer and connected to the data line; and a pixel electrode connected to the thin film transistor,
    wherein the first auxiliary line is between pixel electrodes adjacent along the second direction and the second auxiliary line is between pixel electrodes adjacent along the first direction, and
    wherein at least one of the first auxiliary line and the second auxiliary line is disconnected at an intersection of the first auxiliary line and the second auxiliary line in a display area.

2. The thin film transistor array panel as claimed in claim 1, wherein the first auxiliary line and the second auxiliary line are on a same layer.

3. The thin film transistor array panel as claimed in claim 2, wherein at least one of the first auxiliary line and the second auxiliary line is electrically disconnected at an intersection of the first auxiliary line and the second auxiliary line.

4. The thin film transistor array panel as claimed in claim 1, wherein the first auxiliary line overlaps the gate line.

5. The thin film transistor array panel as claimed in claim 4, wherein the first auxiliary line is only at a portion corresponding to the gate line.

6. The thin film transistor array panel as claimed in claim 1, wherein the second auxiliary line overlaps the data line.

7. The thin film transistor array panel as claimed in claim 6, wherein the second auxiliary line is only at a portion corresponding to the data line.

8. The thin film transistor array panel as claimed in claim 1, wherein the insulating layer includes a contact hole, the contact hole partially exposing the gate line and the data line.

9. The thin film transistor array panel as claimed in claim 8, wherein the first auxiliary line is connected to the gate line through the contact hole.

10. The thin film transistor array panel as claimed in claim 8, wherein the second auxiliary line is connected to the data line through the contact hole.

11. The thin film transistor array panel as claimed in claim 1, wherein the pixel electrode is on a same layer as at least one of the first auxiliary line and the second auxiliary line.

12. The thin film transistor array panel as claimed in claim 1, wherein the thin film transistor includes:
    a semiconductor on the substrate, the semiconductor having a channel area, a drain area, and a source area;
    a gate electrode insulated from the channel area and overlapping the channel area;
    a source electrode electrically connected to the source area; and
    a drain electrode electrically connected to the drain area.

13. A method for manufacturing a thin film transistor array panel, the method comprising:
    forming a gate line extending in a first direction on a substrate;
    forming a data line extending in a second direction on the substrate and intersecting the gate line;
    forming a thin film transistor connected to the gate line and the data line;
    forming an insulating layer on the gate line, the data line, and the thin film transistor; forming a first auxiliary line on the insulating layer and connected to the gate line;
    forming a second auxiliary line on the insulating layer and connected to the data line; and forming a pixel electrode connected to the thin film transistor,
    wherein the first auxiliary line is between pixel electrodes adjacent along the second direction and the second auxiliary line is between pixel electrodes adjacent along the first direction, and
    wherein at least one of the first auxiliary line and the second auxiliary line is disconnected at an intersection of the first auxiliary line and the second auxiliary line in a display area.

14. The method as claimed in claim 13, further comprising:
    forming a contact hole in the insulating layer to expose the gate line and the data line;
    forming a passivation layer on the first auxiliary line, the second auxiliary line, and the insulating layer; and
    forming a contact hole in the passivation layer to expose a drain electrode of the thin film transistor, the pixel electrode being connected to the drain electrode of the thin film transistor.

15. The method as claimed in claim 13, further comprising:
   forming a contact hole in the insulating layer to expose the gate line, the data line, and a drain electrode of the thin film transistor; and
   connecting the pixel electrode to the drain electrode of the thin film transistor.

\* \* \* \* \*